(12) United States Patent
Moindron

(10) Patent No.: US 7,728,633 B2
(45) Date of Patent: Jun. 1, 2010

(54) WINDOW COMPARATOR OF AN A.C. VOLTAGE

(75) Inventor: Laurent Moindron, Notre-Dame-d'Oe (FR)

(73) Assignee: STMicroelectronics S.A., Montrouge (FR)

( * ) Notice: Subject to any disclaimer, the term of this patent is extended or adjusted under 35 U.S.C. 154(b) by 134 days.

(21) Appl. No.: 11/787,885

(22) Filed: Apr. 18, 2007

(65) Prior Publication Data
US 2007/0247198 A1 Oct. 25, 2007

(30) Foreign Application Priority Data
Apr. 19, 2006 (FR) .................................. 06 51379

(51) Int. Cl.
*H03K 5/22* (2006.01)
(52) U.S. Cl. .............................. 327/74; 327/75; 327/76
(58) Field of Classification Search .................. 327/66, 327/74, 75, 76
See application file for complete search history.

(56) References Cited

U.S. PATENT DOCUMENTS

| 4,968,901 A | * | 11/1990 | Shacter ......................... 327/74 |
| 5,224,007 A | * | 6/1993 | Gill, Jr. ........................ 361/45 |
| 5,446,397 A | * | 8/1995 | Yotsuyanagi ................. 327/66 |
| 5,477,170 A | * | 12/1995 | Yotsuyanagi ................. 327/66 |
| 5,963,062 A |   | 10/1999 | Fujii |
| 6,323,695 B1 | * | 11/2001 | Heinrich ....................... 327/89 |

FOREIGN PATENT DOCUMENTS

DE EP 352734 * 1/1990

OTHER PUBLICATIONS

French Search Report from corresponding French Application No. 06/51379, filed.
French Search Report from corresponding French Application No. 06/51379, Dec. 2006.
Djemouai A, et al., *New CMOS Current-Mode Amplitude Shift Keying Demodulator (ASKD) Dedicated For Implantable Electronic Devices*, Circuits and Systems, 2004, ISCAS '04 Proceedings of the 2004 International symposium on Vancouver, BC, Canada May 23-26, 2004, Piscataway, NJ, IEEE, US May 23, 2004, pp. I-441, XP010719147.

* cited by examiner

*Primary Examiner*—Kenneth B. Wells
(74) *Attorney, Agent, or Firm*—Lisa K. Jorgenson; William R. McClellan; Wolf, Greenfield & Sacks, P.C.

(57) ABSTRACT

A window comparator of an A.C. input voltage, including, between two terminals of application of a voltage representative of the voltage to be measured, two first transistors of a first type, each first transistor being assembled as a current mirror on the second transistor having a first conduction terminal connected to one of the application terminals, the two second transistors having a second common conduction terminal; and two third transistors of a second type assembled as a current mirror between the common conduction terminal of the second transistors and a current source, a D.C. voltage being applied on a first terminal of the current source and an output signal being provided by a second terminal of the current source.

12 Claims, 4 Drawing Sheets

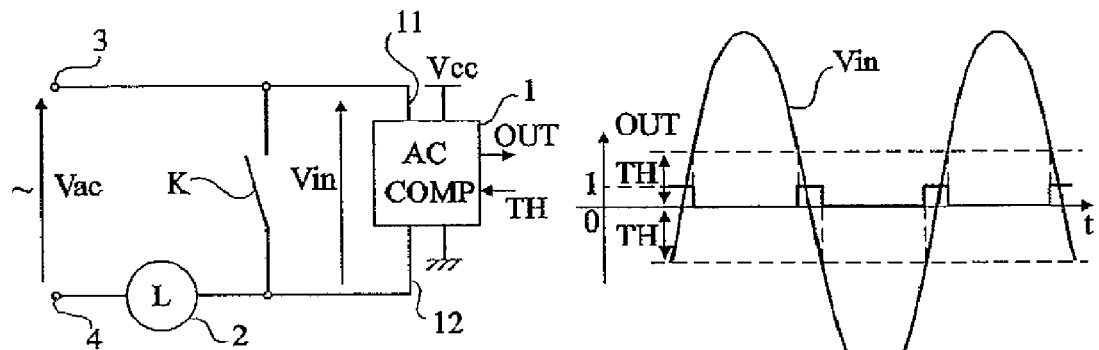
Fig 1 (Prior Art)
Fig 2 (Prior Art)
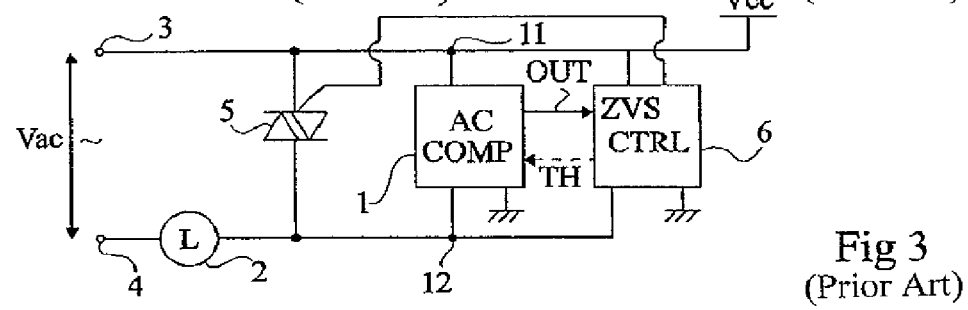
Fig 3 (Prior Art)
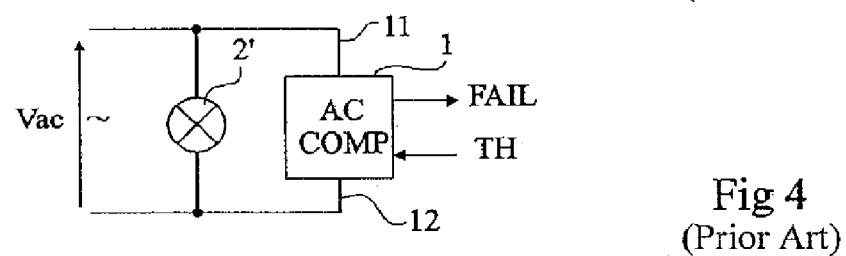
Fig 4 (Prior Art)
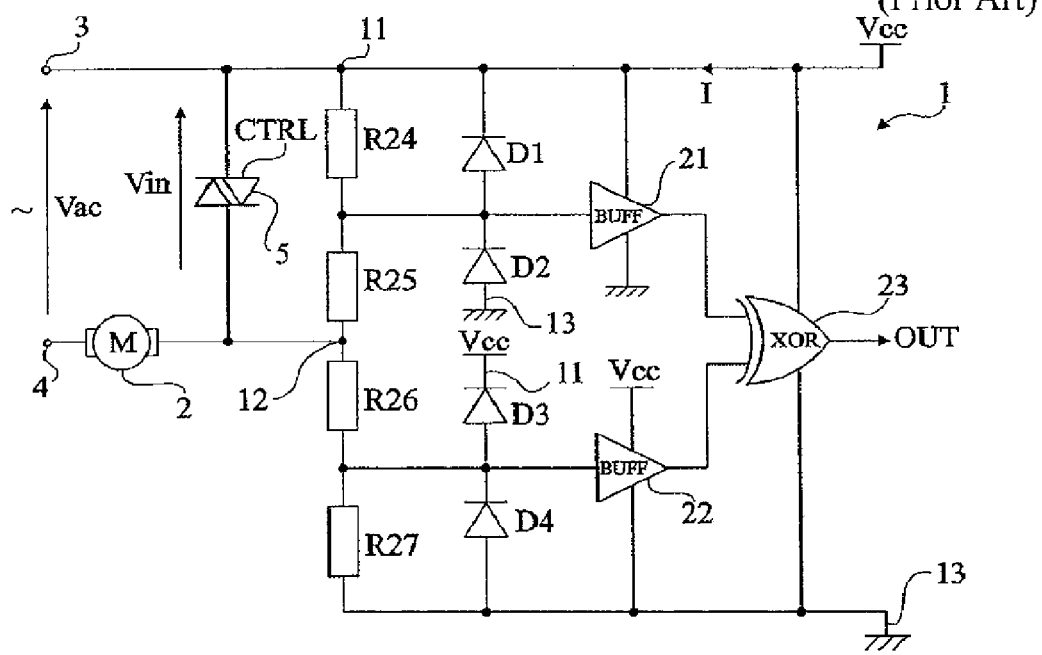
Fig 5 (Prior Art)

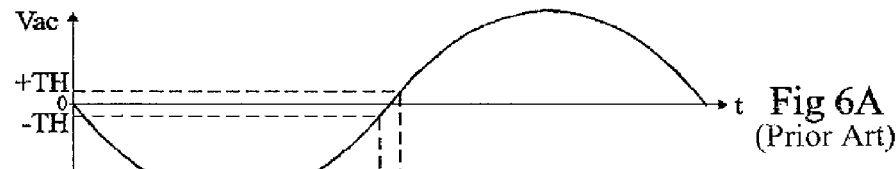
Fig 6A (Prior Art)
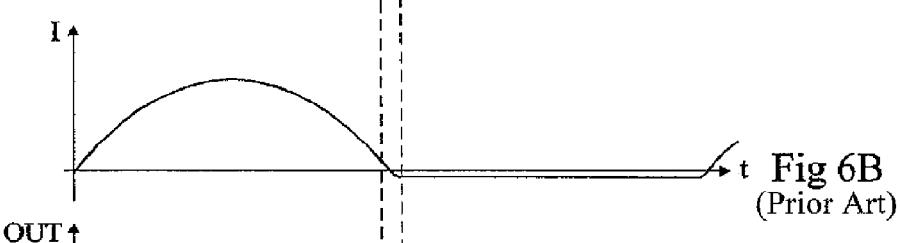
Fig 6B (Prior Art)
Fig 6C (Prior Art)
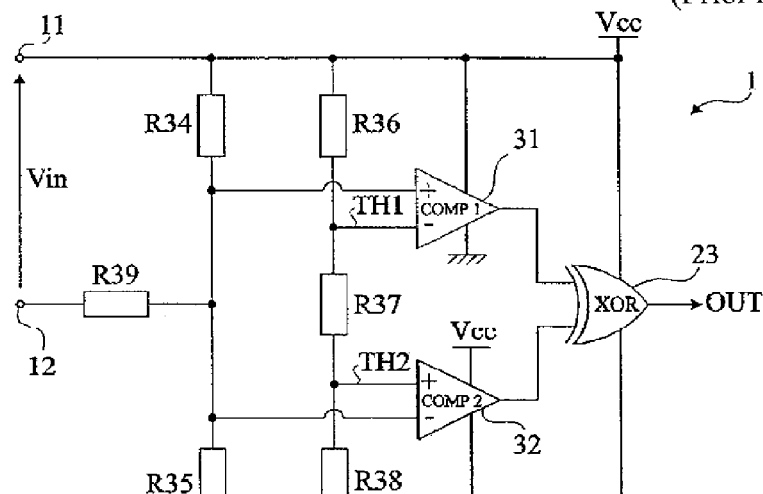
Fig 7 (Prior Art)
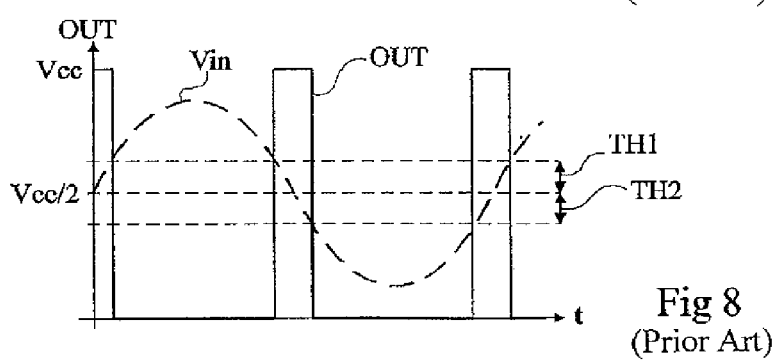
Fig 8 (Prior Art)

WINDOW COMPARATOR OF AN A.C. VOLTAGE

BACKGROUND OF THE INVENTION

1. Field of the Invention

The present invention generally relates to comparators of an A.C. voltage with respect to a threshold and, more specifically, to window comparators which detect the presence of an A.C. voltage within a window defined by thresholds around the zero voltage.

The present invention applies, for example, to detectors of failures of an A.C. load supply switch. The present invention also applies, for example, to detectors of zero crossings for triggering switches around the zero of an A.C. supply voltage. The present invention also applies, for example, to the detection of the state of a load as to its power supply, for example, the detection of the state of a high-intensity discharge lamp, used in particular in the automobile field.

2. Discussion of the Related Art

FIG. 1 very schematically shows an example of an assembly using an A.C. comparator 1 (AC COMP) of the type to which the present invention applies. In this example, a load 2 (L) is in series with a bi-directional switch K between two terminals 3 and 4 of application of an A.C. supply voltage Vac. Comparator 1 comprises two input terminals 11 and 12 respectively connected across switch K and compares the absolute value of voltage Vin across this switch with a threshold TH. Comparator 1 is powered by a relatively low D.C. voltage Vcc (typically from a few volts to a few tens of volts) with respect to the relatively high A.C. power supply voltage and provides a two-state detection signal OUT according to whether voltage Vin exceeds or not in absolute value threshold TH.

FIG. 2 illustrates, in a timing diagram, the operation of comparator 1 of FIG. 1. A.C. voltage Vin is assumed to be identical to voltage Vac (switch K off) and output signal OUT is in this example assumed to be activated (state 1 typically corresponding to level Vcc) when voltage Vin is within the window defined by threshold TH around level 0.

FIG. 3 shows an example of application of the present invention to the detection of the zero crossing of an A.C. supply voltage Vac applied between two terminals 3 and 4 of a circuit formed of a load 2 in series with a bidirectional A.C. switch (in this example, a triac 5). Circuit 1 provides result OUT of its detection to a circuit 6 (CTRL) for controlling triac 5. Threshold TH is set by circuit 6 and typically is an amplitude of a few volts around the voltage zero so that signal OUT is sent onto an input ZVS of circuit 6 to allow it to start the conduction periods of switch 5 around the voltage zero. Circuit 6 is, like circuit 1, supplied by a low D.C. voltage Vcc.

FIG. 4 very schematically shows in the form of blocks another example of application of the present invention to the detection of malfunctions (output FAIL of circuit 1) of a discharge lamp 2' supplied with an A.C. voltage Vac. For simplification, the control switch of lamp 2' has not been illustrated. The function of detector 1 is to detect the state (excited or not) of lamp 2' by comparing the absolute value of the voltage thereacross with threshold TH.

FIG. 5 shows the electric diagram of a first conventional example of a window comparator of an A.C. voltage. A comparison of voltage Vin across a triac 5 for controlling a motor M with respect to two thresholds surrounding the average level of the A.C. voltage is assumed. The comparator of FIG. 5 is based on the use of voltage-limiting diodes D1 to D4 at the input of level matching amplifiers 21 and 22 (BUFF) having their outputs combined by a logic gate 23 (XOR) performing an XOR-type function and providing signal OUT. The input of first amplifier 21 is connected to the junction point of resistors R24 and R25 connected to terminals 11 and 12 of triac 5, as well as to the junction point of two first diodes D1 and D2 between the terminals of application of D.C. voltage Vcc. In this example, the positive terminal of application of voltage Vcc is confounded with terminal 11 and with terminal 3 while ground terminal 13 has no link with the A.C. power supply. The input of second amplifier 22 is connected to the junction point of two resistors R26 and R27 between terminal 12 and ground 13 as well as to the junction point of two second diodes D3 and D4 between terminals 11 and 13. Threshold TH around the voltage zero is set (on the positive side), by the ratio of resistors R24 and R25 and, on the negative side, by the ratio of resistors R26 and R27. For example, R24=R27 and R25=R26.

A disadvantage of the circuit of FIG. 5 is its bulk. It requires four resistors, four diodes, two level matching amplifiers as well as one logic XOR gate.

Another disadvantage is the presence of negative potentials with respect to ground (voltage of a diode junction in negative halfwaves), which complicates the integration.

FIGS. 6A, 6B, and 6C illustrate examples of timing diagrams respectively showing voltage Vac, current I injected into low-voltage source Vcc, and signal OUT, the operation of the circuit of FIG. 5. FIG. 6B illustrates an additional disadvantage of this circuit which is, in positive halfwaves of A.C. voltage Vac, its generating an inverse current in D.C. voltage Vcc. Such a current risks damaging voltage source Vcc, especially if it reaches a voltage greater than that controlled by a voltage regulator due to the injected parasitic current.

FIG. 7 shows a second conventional embodiment of comparator 1' of an A.C. voltage Vin with respect to a threshold around the voltage zero. To simplify the representation of FIG. 7, the elements upstream of the window comparator have not been illustrated.

The circuit of FIG. 7 uses two differential comparators 31 and 32 supplied by voltage Vcc and having their respective outputs combined by an XOR-type gate 23 also powered by voltage Vcc and providing signal OUT. First inputs (respectively non-inverting and inverting) of comparators 31 and 32 are connected to the junction point of two resistors R34 and R35 between terminals 11 and 13 (ground), this junction point being also connected to terminal 12 by a resistor R39 of high value (on the order of one Megohm) having the function of holding the voltage with respect to the downstream circuit. Second inputs (inverting and non-inverting) of comparators 31 and 32 are respectively connected to the junction points of three resistors in series R36, R37, and R38 between terminals 11 and 12. This series connection aims at setting threshold TH, resistors R36 and R38 being both of same value.

FIG. 8 is a timing diagram illustrating the operation of the circuit of FIG. 7. This drawing shows an example of the shape of signal OUT with respect to the two thresholds TH1 and TH2 of comparators 1 and 2 here assumed to have the same value.

As compared with the assembly of FIG. 5, the advantage of the circuit of FIG. 7 is that by shifting the comparison with respect to level Vcc/2, it requires no negative voltage. It however maintains the risk of an inverse current in the low D.C. voltage.

Another disadvantage of the circuit of FIG. 7 is that it remains bulky since it requires six resistors, two differential comparators, and one logic gate.

SUMMARY OF THE INVENTION

The present invention aims at overcoming all or part of the disadvantages of known circuits of comparison of an A.C. voltage with respect to a threshold window defined around the average A.C. voltage level.

The present invention more specifically aims at providing a comparator of decreased bulk with respect to conventional solutions to ease its integration.

The present invention also aims at avoiding any risk of current inversion in the low D.C. voltage providing the detection signal.

To achieve all or part of these objects, as well as others, the present invention provides a window comparator of an A.C. input voltage, comprising:

between two terminals of application of a voltage representative of the voltage to be measured, two first transistors of a first type, each first transistor being assembled as a current mirror on the second transistor having a first conduction terminal connected to one of said application terminals, the two second transistors having a second common conduction terminal; and two third transistors of a second type assembled as a current mirror between said common conduction terminal of the second transistors and a current source, a D.C. voltage being applied on a first terminal of said current source and an output signal being provided by a second terminal of the current source.

According to an embodiment of the present invention, the detection window is set by the value of the current source.

According to an embodiment of the present invention, said voltage representative of the voltage to be measured is applied via a resistor.

According to an embodiment of the present invention, the comparator is made in the form of an integrated circuit.

According to an embodiment of the present invention, the transistors are bipolar transistors, the first type being PNP and the second type being NPN.

According to an embodiment of the present invention, the transistors are MOS transistors, the first type being with a P channel and the second type being with an N channel.

The present invention also provides a circuit for controlling a switch in the vicinity of the zero crossing of an A.C. supply voltage comprising a window comparator.

The present invention also provides a circuit for detecting a possible failure of a load powered by an A.C. voltage, comprising a window comparator.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 1, previously described, very schematically shows an example of application of a window comparator aimed at by the present invention;

FIG. 2, previously described, is a timing diagram illustrating the operation of the assembly of FIG. 1;

FIG. 3, previously described, very schematically shows in the form of blocks a second example of application of the present invention to a circuit of control at the voltage zero;

FIG. 4, previously described, shows another example of application of the present invention to an error detection on a discharge lamp;

FIG. 5, previously described, shows the electric diagram of a first conventional example of a window comparator;

FIGS. 6A, 6B, and 6C, previously described, are timing diagrams illustrating the operation of the circuit of FIG. 5;

FIG. 7, previously described, shows the electric diagram of a second conventional example of a window comparator;

FIG. 8, previously described, is a timing diagram illustrating the operation of the circuit of FIG. 7;

DETAILED DESCRIPTION

Figure 9:
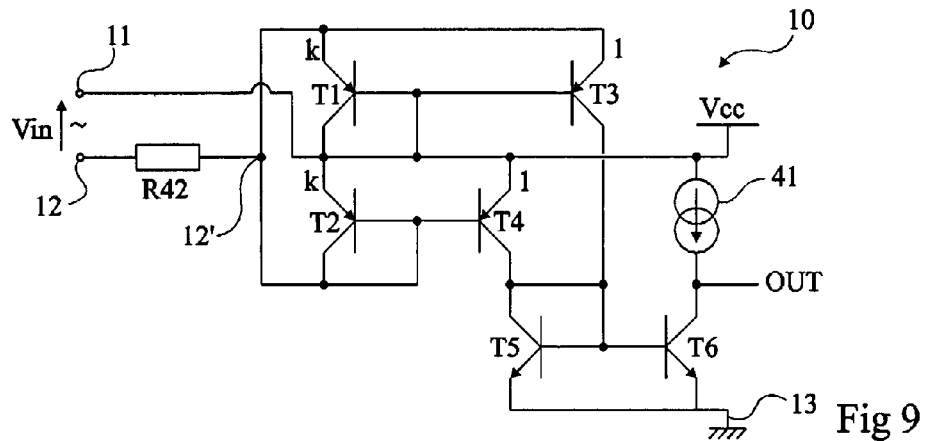
FIG. 9 shows the electric diagram of an embodiment of a window comparator according to the present invention.

The same elements have been designated with the same reference numerals in the different drawings which have been drawn out of scale for the timing diagrams. For clarity, only those elements which are useful to the understanding of the present invention have been shown and will be described. In particular, the control circuits of the switches associated with the loads that the present invention aims at monitoring by means of the window comparator have not been detailed, the present invention being compatible with any conventional application.

FIG. 9 shows an embodiment of a circuit 10 forming a window comparator according to the present invention. In FIG. 9, only the comparator has been shown and its connection across the circuit where it detects the input voltage, has not been illustrated. Comparator 10 compares an A.C. voltage Vin present between two terminals 11 and 12 with respect to a window around the voltage zero defined by a current threshold (current source 41). Two bipolar PNP-type transistors T1 and T2 are each connected between a terminal 12' and terminal 11 corresponding to the terminal of application of a D.C. voltage Vcc. Terminal 12' is connected to input terminal 12 of application of the A.C. voltage via a resistor R42 of high value having the function of ensuring the voltage hold of comparator 10 with respect to A.C. voltage Vin. The emitter of transistor T1 is connected to terminal 12' while the emitter of transistor T2 is connected to terminal 11. Transistor T1 is connected as a diode and as a current mirror on a PNP transistor T3 having its emitter connected to terminal 12'. The bases of transistors T1 and T3 are connected to the collector of transistor T1 (terminal 11). Transistor T2 is assembled as a diode and as a current mirror on a PNP transistor T4 having its emitter connected to terminal 11 and having its collector connected to that of transistor T3. The bases of transistors T2 and T4 are connected to the collector of transistor T2. A current mirror formed of two NPN-type transistors T5 and T6 draws from source 41 a current proportional to that of the collector of transistor T3 or T4 according to the halfwave of voltage Vin. Transistor T5 has its collector connected to its base and to the collectors of transistors T3 and T4 and its emitter connected to ground 13. Transistor T6 has its emitter connected to ground and its collector, Defining output terminal OUT, connected to current source 41. The bases of transistors T5 and T6 are interconnected to the collectors of transistors T3, T4, and T5.

Figure 10:
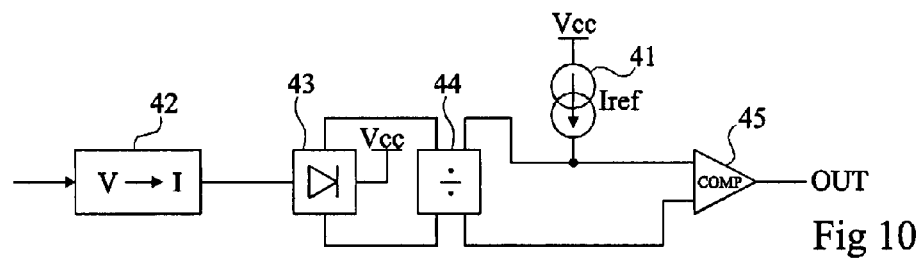
FIG. 10 is a functional block diagram illustrating the operation of the circuit of FIG. 9.

FIG. 10 illustrates in the form of a block diagram the functions performed by the circuit of FIG. 9.

Figure 11:
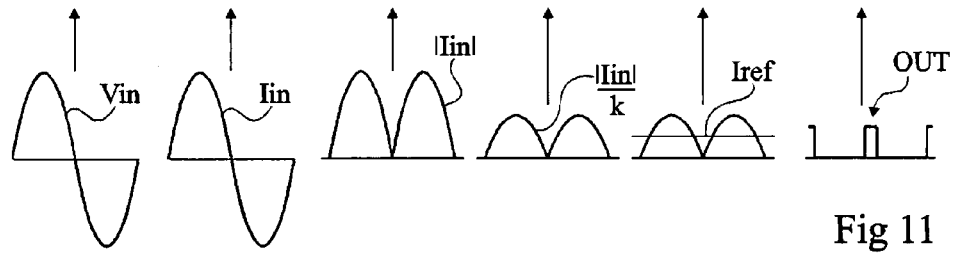
FIG. 11 shows very simplified shapes of signals illustrating the operation of the comparator of the present invention.

FIG. 11 illustrates the operation of the circuit of FIG. 10 by showing examples of shapes of characteristic signals.

A first function 42 (V→I) is a voltage-to-current conversion ensured by resistor R42 which converts input A.C. voltage Vin into a current Iin (FIG. 11). Transistors T1 and T2 perform a fullwave rectification function 43. This rectification is performed with respect to voltage level Vcc, which avoids the presence of a negative voltage downstream. The current mirror of transistors T1 and T3 (respectively T2 and T4) performs a function 44 of voltage division by a ratio k set by the ratio between the emitter surface areas of the transistors (k for transistors T1 and T2, 1 for transistors T3 and T4). A ratio between transistors T2 and T4 different from that between transistors T1 and T3 would provide different thresholds for the positive and negative halfwaves. Current source 41 provides a D.C. reference current, preferably constant, from which the current of transistor T3 or T4 is subtracted by means of transistor T6 mirror-assembled on transistor T5. This amounts to a function 45 of comparison of the measured current with respect to the reference current. If the measured current is greater than current Iref, output OUT is at the low level (all of current Iref is absorbed by transistor T6). Otherwise, current source 41 enables a non-zero level on output OUT.

Current source 41 is formed, for example, by means of a resistor, of a transistor assembly known as a Widlar source or any other integrated current source.

An advantage of this embodiment of the present invention is that the forming of the window comparator is particularly simple. A single resistor is required and three current mirror assemblies of two transistors each are sufficient.

Another advantage of this embodiment is that it ensures a self-protection against ESD (electrostatic discharge) disturbances since it is a current solution.

Another advantage of a current solution is that it makes the assembly insensitive to voltage variations and to stray capacitances, which reduces detection delays.

Another advantage of the present invention is that no negative current flows on the D.C. supply side, which protects a voltage regulator that may be present.

Figure 12:
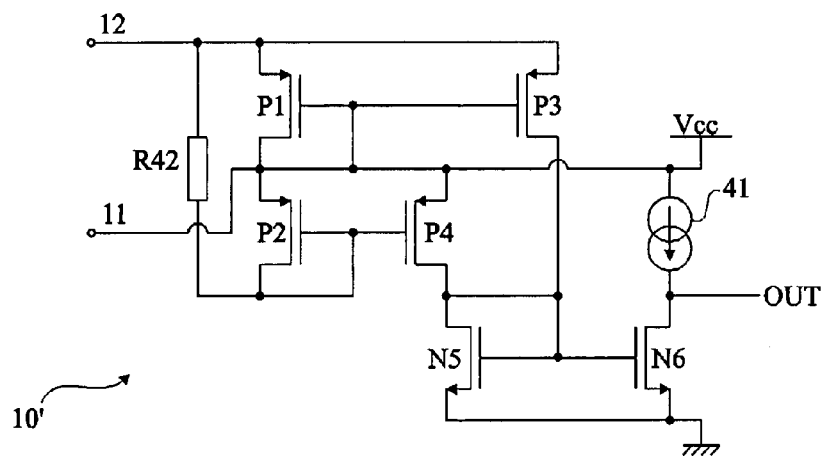
FIG. 12 shows another embodiment of a window comparator according to the present invention.

FIG. 12 shows a window comparator 10' according to a second embodiment based on the use of MOS transistors. As compared with the assembly of FIG. 9, the PNP bipolar transistors are replaced with P-channel MOS transistors P1, P3, P2, and P4 and the NPN bipolar transistors are replaced with N-channel MOS transistors N5 and N6.

The operation of the assembly of FIG. 12 can be deduced from that discussed in relation with FIG. 9.

Figure 13:
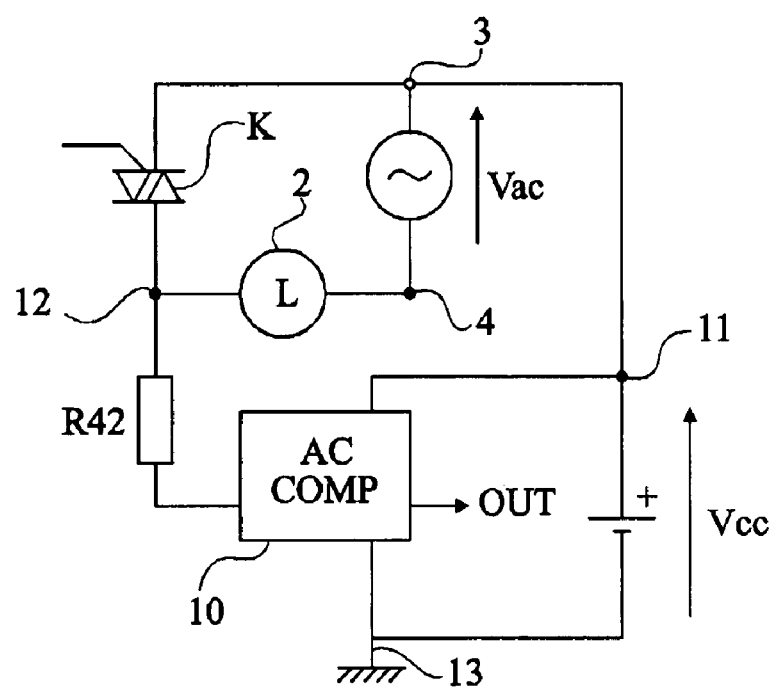
FIG. 13 very schematically shows in the form of blocks an example of application of the present invention in an assembly detecting the power supply of a load controlled by a bidirectional switch.

FIG. 13 shows an example of application of window comparator 10 of the present invention in an assembly of detection of the operation of a load 2 (L) powered by an A.C. voltage Vac applied between two terminals 3 and 4, load 2 being in series with a bidirectional switch K (for example, a triac). In the example of FIG. 13, resistor R42 of access to circuit 10 has been shown as external to illustrate the fact that all the components of window comparator 10 are preferentially made in the form of an integrated circuit. Terminal 12 is connected to the junction point of load 2 and switch K. Terminal 11 of application of the positive voltage of voltage Vcc is connected to terminal 3 while its negative terminal represents ground 13 with respect to which signal OUT is referenced.

Of course, the present invention is likely to have various alterations, modifications, and improvements which will readily occur to those skilled in the art. In particular, the dimensions to be given to the different transistors, be the embodiment based on bipolar or MOS transistors, are within the abilities of those skilled in the art according to the application. It should however be noted that the currents withstood by these transistors are, except for the first two (T1, T2, P1, P2), currents attenuated with respect to the input currents.

Further, the possible adaptations of the present invention according to the circuit destination are also within the abilities of those skilled in the art. For example, the surface ratios of the different mirrors are to be adapted according to the ratio between voltages Vin and Vcc for mirrors T1/T3 and T2/T4 (or P1/P3 and P2/P4) and according to current Iref with respect to the current measured for mirror T5/T6 or N5/N6). Current Iref may, if need be, be modulated by a parameter based on current source 41 then preferentially based on transistors.

Moreover, dual assemblies may be provided by inverting the conductivity or channel types of the transistors for a negative or zero output signal.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A window comparator of an A.C. input voltage, consisting of:
    between two terminals of application of a voltage representative of the voltage to be measured, two first transistors of a first type, each first transistor being assembled as a current mirror on a second transistor having a first conduction terminal connected to one of said application terminals, the two second transistors having a second common conduction terminal, the two first transistors performing full wave rectification of said voltage representative of the voltage to be measured; and
    two third transistors of a second type assembled as a current mirror between said common conduction terminal of the second transistors and a current source, a D.C. voltage being applied on a first terminal of said current source and an output signal being provided by a second terminal of the current source, wherein the two third transistors are configured to compare a measured current provided by the two second transistors to a reference current provided by the current source and to provide the output signal indicative of a result of the comparison, said voltage representative of the voltage to be measured being applied via a resistor.

2. The comparator of claim 1, wherein the detection window is set by the value of the current source.

3. The comparator of claim 1, made in the form of an integrated circuit.

4. The comparator of claim 1, wherein the transistors are bipolar transistors, the first type being PNP and the second type being NPN.

5. The comparator of claim 1, wherein the transistors are MOS transistors, the first type being with a P channel and the second type being with an N channel.

6. A circuit for controlling a switch in the vicinity of the zero crossing of an A.C. supply voltage comprising the window comparator of claim 1.

7. A circuit for detecting a failure of a load powered by an A.C. voltage, comprising the window comparator of claim 1.

8. A window comparator of an A.C. input voltage, consisting of:
- first and third transistors, of a first conductivity type, connected as a first current mirror;
- second and fourth transistors, of the first conductivity type, connected as a second current mirror, the first and second transistors connected, with opposite polarity, between first and second terminals representative of a voltage to be measured, the third and fourth transistors connected to the first and second terminals, respectively, the first and second transistors performing full wave rectification of the voltage representative of the voltage to be measured;
- a current source to provide a reference current; and
- fifth and sixth transistors, of a second conductivity type, connected as a third current mirror, the third current mirror receiving a measured current from the third and fourth transistors, the sixth transistor connected to the current source and providing an output signal of the window comparator, wherein the fifth and sixth transistors are configured to compare the measured current to the reference current and to provide the output signal indicative of a result of the comparison, the voltage to be measured being applied to the second terminal through a resistor.

9. A window comparator as defined in claim 8, wherein a detection window is set by the reference current.

10. A window comparator as defined in claim 8, wherein a D.C. voltage is applied to the current source.

11. A window comparator as defined in claim 8, wherein the transistors are bipolar transistors, wherein the transistors of the first conductivity type are PNP transistors and wherein the transistors of the second conductivity type are NPN transistors.

12. A window comparator as defined in claim 8, wherein the transistors are MOS transistors, wherein the transistors of the first conductivity type are P channel transistors and wherein the transistors of the second conductivity type are N channel transistors.

* * * * *